HIGH-FREQUENCY TUNER

Filed Aug. 3, 1948

INVENTORS
James M. Clark
William H. Counts
Foorman L. Mueller
Atty.

Patented Sept. 4, 1951 2,566,759

UNITED STATES PATENT OFFICE 2,566,759

HIGH-FREQUENCY TUNER

James M. Clark, Hinsdale, and William H. Counts, La Grange, Ill., assignors to Motorola, Inc., Chicago, Ill., a corporation of Illinois Application August 3, 1948, Serial No. 42,196

6 Claims. (Cl. 178—44)

This invention relates generally to tuners and more particularly to a very high frequency tuning unit including a variable resonant cavity.

With the use of frequencies above 100 megacycles becoming more common, a need has developed for a simple and inexpensive tuning unit which is effective for operation at such frequencies. The well known variable condenser and permeability tuners are not entirely satisfactory at such frequencies. Variable condenser tuners having the required Q require a relatively large space. Permeability tuners have relatively high impedance and for satisfactory use, the components must be carefully controlled. Attempts have been made to use transmission lines and resonant cavity tuners but the prior structures have not been completely satisfactory. Transmission line tuners, the inductance of which is variable by a shorting bar, have the disadvantage that the movable contact is at a high current, low voltage point so that tuning thereof is difficult and defective operation often occurs.

It is, therefore, an object of the present invention to provide an improved very high frequency tuning unit which is of simple and inexpensive construction.

A further object of this invention is to provide a very high frequency resonant cavity tuner which is tunable through a wide frequency range.

Another object of this invention is to provide a very high frequency tuning unit having very high Q and relatively low impedance.

A feature of this invention is the provision of a cavity tuner which is adjustable in length and in which the moving contacts are near the high voltage end of the cavity and at relatively low current points.

Another feature of this invention is the provision of a tuning unit including an adjustable resonant cavity and a tuning capacitor constructed as a single unit so that connecting leads are not required.

A still further feature of this invention is the provision of a very high frequency tuning unit which may be adjusted to be resonant through a wide range of frequencies and which is constructed of simple and inexpensive components providing a hermetically sealed unit.

Further objects, features and advantages will be apparent from a consideration of the following description when taken in connection with the accompanying drawings in which.

Figures 1, 2, 3, 4:
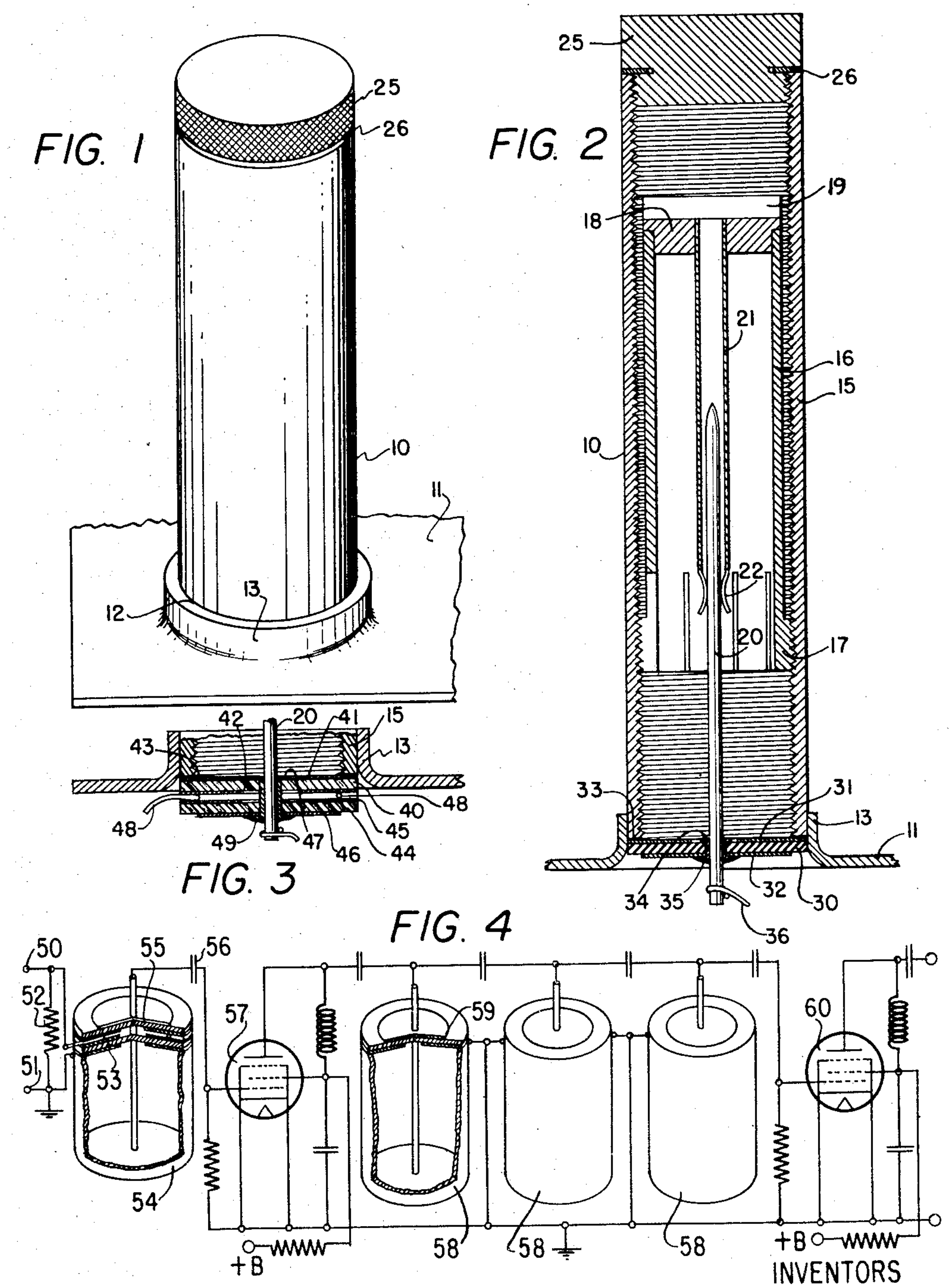
Fig. 1 is a perspective view of the tuning unit in accordance with the invention mounted on a chassis.
Fig. 2 is a cross-sectional view illustrating the construction of the tuning unit.
Fig. 3 is a cross-sectional fragmentary view illustrating a modified construction.
Fig. 4 illustrates the use of the tuning units in a radio receiver circuit.

In practicing the invention there is provided a tuning unit including an adjustable resonant cavity and a coaxial condenser. The cavity includes coaxial conductors electrically interconnected at one end and physically connected at the other end by an insulating member. Each of the conductors is formed by a pair of telescoping members so that the length of the cavity may be adjusted. The electrical contacts between the telescoping members are adjacent the electrically open end of the cavity so that they are near the high voltage, low current points and, therefore, the contact resistance is not as critical. The insulating member forms the dielectric of a coaxial capacitor which is in effect bridged across the cavity. The conducting plates of the capacitor directly engage the conductors of the cavity so that interconnecting leads are not required. Various capacitor structures may be provided depending upon the application of the tuning unit. The tuning unit is hermetically sealed so that it will not be deleteriously affected by the elements.

Fig. 1 illustrates the tuning unit 10 mounted on the chassis portion 11 of a very high frequency electronic equipment. It will be noted that the tuning unit is of cylindrical shape and is mounted in an opening 12 in the chassis. A shoulder 13 is provided about the opening 12 and the tuning unit may be secured to the chassis by being pressed tightly therein. One connection to the tuning unit may be made directly through the chassis as will be more fully explained.

In Fig. 2 the detailed construction of the tuning unit is shown. The cavity includes an outer conductor which is formed by the tubular members 15 and 16. The member 15 has threads on the inner surface thereof and the member 16 includes an enlarged end portion 17 with threads engaging the threads of the member 15. The portion 17 is slotted to provide spring fingers which bear firmly against the outer tubular member 15 to provide low resistance contact therewith. A conducting end closure 18 is provided for the member 16 and serves to terminate the cavity defined by the members 15 and 16. It is apparent that the length of the cavity may be adjusted by changing the position of the tubular member 16 with respect to the tubular member 15. The closure 18 is provided with a slot 19 which may be engaged by a screwdriver so that the adjustment of the length of the cavity may be easily accomplished.

An inner conductor is provided in the cavity including the rod 20 and the tubular member 21. The member 21 is secured to the closure 18 so that the tubular member 16, end closure 18 and tubular member 21 move as a unit. The tubular member 21 includes spring fingers 22 which engage the rod 20 to make firm electrical contact therewith. It will be noted that the tubular member 15 extends beyond the member 16 and has a threaded plug 25 positioned therein. The plug 25 and the sealing ring 26 are for the purpose of sealing the top end of the tuning unit and have no electrical function. The plug 25 and the insulating disc 30 provide end closures for the outer tubular member 15 to form a hermetically sealed unit. The plug 25 may be removed when it is desired to adjust the position of the movable members of the cavity.

The lower end of the cavity is closed by an insulating disc 30 having conducting coatings 31 and 32 on the opposite sides thereof. The conducting coatings form the plates of a capacitor with the insulating disc as the dielectric. The insulating disc should preferably be made of ceramic material to provide the required physical strength and dielectric properties. The coating 31 does not extend to the center of the disc being in the form of a ring. The outer edges of the coating 31 are tinned as indicated at 33 and the end of the tubular member 15 is also tinned so that when the insulating disc is positioned adjacent to the end of the tubular member and heat is applied thereto, the members will be soldered together. The coating 32 is spaced from the edge of the disc so that it is spaced from the member 15 and the chassis 11. An eyelet 34 is provided at the center of the insulating disc 30 and engages the coating 32. The eyelet makes a close fit with the rod 20, and to provide good electrical contact between the conducting coating 32, the eyelet 34 and the rod 20, solder may be applied as indicated at 35. The capacitor, therefore, is in effect bridged across the inductance produced by the cavity to provide a resonant circuit. Connection can be made to the tuning unit from the chassis 11 through the shoulder 13 which engages the tubular member 15, and by making connection to the rod 20 as indicated at 36.

In certain applications it may be desired to provide two capacitors in series across the cavity. A modified structure for providing this arrangement is illustrated in Fig. 3. In this structure a first insulating disc 40 is provided with conducting coatings 41 and 42 on the opposite sides thereof. These coatings are both spaced from the center of the insulating member 40 forming rings. The capacitor thus formed may be secured to the end of the tubular member 15 by solder 43 in the same manner as in Fig. 2. A second capacitor is formed by the insulating disc 44 and the conducting coatings 45 and 46 on the opposite sides thereof. The coating 45 is in the form of a ring similar to coatings 41 and 42 and the coating 46 is applied at the center. An eyelet 47 extending through the two insulating members 40 and 44 holds the unit together and makes contact with the coating 46 and the center rod 20. A small wire 48 may be positioned between the capacitors, engaging the coatings 42 and 45. In order to make good contact and form a rigid unit, the wire may be soldered to both coatings. Solder is applied at 49 to make good connection at rod 20, eyelet 47 and the coating 46. It is, therefore, seen that the two capacitors are connected in series between the outer conductor 15 and center rod 20 of the cavity. Connection can be made to the common terminal between the capacitors by connecting to the wire 48. The two capacitors may have the same or different values of capacity as may be required in a particular application.

In Fig. 4 there is illustrated the radio frequency portion of a receiver circuit in which the tuning units may be used. The circuit includes terminals 50 and 51 to which an incoming signal may be applied as from an antenna. The antenna circuit includes a tuning unit such as illustrated in Fig. 3. The signal from the antenna is applied across resistor 52 and the capacitor 53 which is the inner capacitor in the tuning unit. The resonant cavity 54 is connected across the capacitor 53 and the outer capacitor 55 which are in series to provide an impedance matching circuit. The common terminal between the capacitor 55 and the cavity 54 (the center conductor of the tuning unit) is connected through capacitor 56 to the radio frequency amplifier stage including tube 57. The radio frequency amplifier stage includes a plurality of tuning units in accordance with the invention in the output circuit thereof but in other respects may be in accordance with well known constructions. Two or more tuning units are connected in the output circuit, being bridged from the plate of the tube 57 to ground with the resonant cavity 58 and the concentric capacitor 59 connected in parallel. These units may be in accordance with Fig. 2 in which a single capacitor bridges the resonant cavity. The radio frequency amplifier may be coupled to additional stages as indicated by tube 60 as desired in a particular application.

Tuning units as above described have been found very satisfactory in actual use. Such units have been tested in the frequency range around 160 megacycles and it has been found that units can be constructed which are variable through the frequency range from 140 to 180 megacycles. The outer tubular conductor 15 is threaded throughout the entire length thereof and permits fine tuning adjustment. The effective Q of the tuning units is very high because the impedance thereof is lower than the tube input impedance. As the electrical contacts are located near the high voltage end of the tuner, the Q is not reduced substantially by the contact resistance. In tuning units for operation at 160 megacycles the impedance is approximately 5,000 ohms which is equal to or less than the tube impedance and therefore the tube loading is 50% or less. The inductance of the cavity is very low permitting the use of a large capacity so that the total impedance is low. This is facilitated by the unitary construction which eliminates leads between the capacitor and the inductance formed by the resonant cavity. The use of a high Q coaxial capacitor at the high voltage end of the resonant cavity provides a tuner small enough for practical use in receivers. This construction also prevents signal radiation from the high voltage end so that an additional shield is not required.

The operation of the tuning units is improved due to the hermetic sealing of the units. This prevents the entry of moisture and foreign material into the tuner. The operation of the unit is also improved by the use of silicone compound on the threads between the tubular members 15 and 16. Such a compound on the threads keeps the oxygen or other gases from contacting the metal to cause oxidation or other deleterious chemical action thereof. The contacting area between the two members is actually wiped clean so that the silicone compound, which in itself is not conducting, does not cause high resistance between the conducting members. As the silicone compound has substantially constant viscosity over a wide temperature range, it is particularly suitable for this use.

The tuning units also have the advantage that they are much less expensive than comparable tuning units now available. It is apparent that the components are all of such configuration that they can be made from standard stock and the machining and assembly operations are simple so that production line methods can be used.

While certain embodiments of the invention which are illustrative thereof have been described, it is obvious that various changes and modifications can be made therein without departing from the intended scope of the invention as defined in the appended claims.

We claim:

1. A resonant cavity tuning unit including first and second telescoping assemblies, said first assembly including an outer cylindrical conductor, an inner conductor, and first and second end closures sealing the ends of said outer cylindrical conductor to hermetically seal said unit, said outer cylindrical conductor being threaded on the inside surface thereof, said first end closure being made of insulating material and supporting said inner conductor, said second end closure having a threaded portion engaging the threads on said cylindrical conductor and being removable from said cylindrical conductor, said second assembly including first and second concentric tubular conductors extending within said outer cylindrical conductor and a conducting member interconnecting said tubular conductors at the ends thereof adjacent said second end closure, said first tubular conductor being inside and spaced from said cylindrical conductor and having a threaded portion extending outwardly at the end thereof opposite to the end connected to said conducting member, said threaded portion engaging the threads on said cylindical conductor and providing the sole connection between said first tubular conductor and said cylindrical conductor, said second tubular conductor having a diameter greater than that of said inner conductor and being spaced thereabout and having a portion extending inwardly at the end thereof opposite to the end connected to said conducting member, said inwardly extending portion being resilient and engaging said inner conductor and providing the sole connection between said second tubular conductor and said inner conductor, said conducting member including provisions to facilitate turning said second assembly to adjust the position of said threaded portion within said threaded cylindrical conductor and thereby adjust the relative positions of said telescoping assemblies and the length of the resonant cavity formed thereby, said removable second end closure providing access to said conducting member to permit adjustment of the position of said second assembly with respect to said first assembly.

2. A resonant cavity tuning unit including first and second telescoping assemblies, said first assembly including an outer cylindrical conductor, an inner conductor, and an insulating member secured to one end of said outer cylindrical conductor and supporting said inner conductor within said outer conductor, said outer cylindrical conductor being threaded on the inside surface thereof, said second assembly including first and second concentric tubular conductors extending within said outer cylindrical conductor and a conducting member interconnecting said tubular conductors at the ends remote from said insulating member, said first tubular conductor being inside and spaced from said cylindrical conductor and having a threaded portion extending outwardly at the end thereof opposite to the end connected to said conducting member, said threaded portion engaging the threads on said outer cylindrical conductor and providing the sole connection between said first tubular conductor and said cylindrical conductor, said second tubular conductor having a diameter greater than that of said inner conductor and being spaced thereabout and having a portion extending inwardly at the end thereof opposite to the end connected to said conducting member, said inwardly extending portion being resilient and engaging said inner conductor and providing the sole conection between said second tubular conductor and said inner conductor, said threaded portion of said first tubular conductor being adjustable within said threaded cylindrical conductor for adjusting the relative positions of said telescoping assemblies and the length of the cavity formed thereby.

3. A resonant cavity tuning unit including first and second telescoping assemblies, said first assembly including an outer cylindrical conductor, an inner conductor, and first and second end closures sealing the ends of said outer conductor to hermetically seal said unit, said first end closure being made of insulating material and supporting said inner conductor, said second end closure being removable from said cylindrical conductor, said second assembly extending within said outer cylindrical conductor and including first and second concentric tubular conductors and a conducting member interconnecting said tubular conductors at the ends thereof adjacent said second end closure, said first tubular conductor being inside and spaced from said cylindrical conductor and having a portion extending outwardly at the end thereof opposite to the end connected to said conducting member, said outwardly extending portion engaging said cylindrical conductor and providing the sole electrical connections between said first tubular conductor and said cylindrical conductor, said second tubular conductor having a diameter greater than that of said inner conductor and being spaced thereabout and having a portion extending inwardly at the end thereof opposite to the end connected to said conducting means, said inwardly extending portion engaging said inner conductor and providing the sole electrical connection between said second tubular conductor and said inner conductor, said second assembly being movable with respect to said first assembly to thereby adjust the length of the cavity formed by said telescoping members.

4. A resonant cavity tuning unit including first and second telescoping assemblies, said first assembly including an outer cylindrical conductor, an inner conductor, and first and second end closures sealing the ends of said outer conductor to hermetically seal said unit, said outer cylindrical conductor being threaded on the inside surface thereof, said first end closure being made of ceramic material and supporting said inner conductor, said second end closure having a threaded portion engaging the threads on said outer conductor and being removable from said cylindrical conductor, said second assembly including first and second concentric tubular conductors extending within said outer cylindrical conductor and a conducting member interconnecting said tubular conductors at the ends thereof adjacent said second end closure, said first tubular conductor having a threaded portion extending outwardly at the end thereof opposite to said conducting member engaging the threads on said outer cylindrical conductor and providing the sole connection therebetween, said second tubular conductor having a diameter greater than that of said inner conductor and having a portion extending inwardly at the end thereof opposite to said conducting means resiliently engaging said inner conductor and providing the sole connection therebetween, and conducting members on opposite sides of said first end closure forming capacitor means connected to the resonant cavity formed by said first and second telescoping assemblies.

5. A resonant cavity tuning unit including first and second telescoping assemblies, said first assembly including an outer cylindrical conductor, an inner conductor, and an insulating plate made of ceramic material secured to one end of said outer cylindrical conductor and supporting said inner conductor, said second assembly including first and second concentric tubular conductors extending within said outer cylindrical conductor and a conducting member interconnecting said tubular conductors at the ends thereof remote from said insulating plate, said first tubular conductor having an outwardly extending portion at the end thereof opposite to the end connected to said conducting member, said outwardly extending portion engaging said cylindrical conductor and providing the sole connection between said first tubular member and said cylindrical conductor, said second tubular conductor having a diameter greater than that of said inner conductor and having an inwardly extending portion at the end thereof opposite to the end connected to said conducting member, said inwardly extending portion being resilient and engaging said inner conductor and providing the sole connection between said second tubular conductor and said inner conductor, and conducting means positioned on the opposite sides of said ceramic insulating plate and individually connected to said outer cylindrical conductor and said inner conductor providing a capacitor connected across the resonant cavity formed by said first and second telescoping assemblies.

6. A resonant cavity tuning unit including first and second telescoping assemblies forming an open cavity, capacitor means connected to said cavity including a pair of dielectric plates, said first assembly including an outer cylindrical conductor and an inner conductor, one of said dielectric plates being secured to one end of said outer cylindrical conductor and supporting said inner conductor therefrom, said second assembly including first and second concentric tubular conductors extending within said outer cylindrical conductor and a conducting member interconnecting said tubular conductors at the ends thereof remote from said one dielectric plate, said first tubular conductor having an outwardly extending portion at the ends thereof opposite to the end connected to said conducting member, said outwardly extending portion engaging said cylindrical conductor and providing the sole connection between said first tubular member and said cylindrical conductor, said second tubular conductor having a diameter greater than that of said inner conductor and having an inwardly extending portion at the end thereof opposite to the end connected to said conducting member, said inwardly extending portion being resilient and engaging said inner conductor and providing the sole connection between said second tubular conductor and said inner conductor, said capacitor means including conducting means on opposite sides of said dielectric plates, with one of said conducting means associated with one of said plates being connected to said outer cylindrical conductor and one of said conducting means associated with the other one of said plates being connected to said inner conductor, and with the other conducting means associated with said plates being connected together, to thereby provide a pair of capacitors connected in series across the adjustable resonant cavity formed by said telescoping assemblies.

JAMES M. CLARK.
WILLIAM H. COUNTS.

REFERENCES CITED

The following references are of record in the file of this patent:

UNITED STATES PATENTS

| Number | Name | Date |
|---|---|---|
| 2,109,843 | Kassner | Mar. 1, 1938 |
| 2,132,208 | Dunmore | Oct. 4, 1938 |
| 2,284,379 | Dow | May 26, 1942 |
| 2,351,895 | Allerding | June 20, 1944 |
| 2,427,107 | Landon | Sept. 9, 1947 |
| 2,438,912 | Hansen | Apr. 6, 1948 |
| 2,496,322 | Wallin | Feb. 7, 1950 |